(12) United States Patent
Janardhanan et al.

(10) Patent No.: US 12,375,094 B2
(45) Date of Patent: *Jul. 29, 2025

(54) SYSTEMS AND METHODS FOR ONLINE GAIN CALIBRATION OF DIGITAL-TO-TIME CONVERTERS

(71) Applicant: Texas Instruments Incorporated, Dallas, TX (US)

(72) Inventors: Jayawardan Janardhanan, Bangalore (IN); Yogesh Darwhekar, Bangalore (IN); Subhashish Mukherjee, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/534,861

(22) Filed: Dec. 11, 2023

(65) Prior Publication Data
US 2024/0113722 A1 Apr. 4, 2024

Related U.S. Application Data

(63) Continuation of application No. 17/541,781, filed on Dec. 3, 2021, now Pat. No. 11,843,392.

(51) Int. Cl.
*H03M 1/10* (2006.01)
(52) U.S. Cl.
CPC ................. *H03M 1/1014* (2013.01)
(58) Field of Classification Search
CPC ........ H03M 1/82; H03M 1/1009; H03M 1/84; H03M 1/50; H03M 3/358; H03M 7/3004; H03M 1/10; H03M 1/1023; H03M 1/66; H03M 1/00; H03M 1/0836; H03M 1/86; H03M 3/344; H03M 3/38; G04F 10/005; G04F 10/105; H03L 7/0991; H03L 7/085; H03L 7/1976; H03L 2207/50;

(Continued)

(56) References Cited

U.S. PATENT DOCUMENTS

| 8,497,716 | B2* | 7/2013 | Zhang | H03L 7/1976 327/147 |
| 9,209,958 | B1* | 12/2015 | Palaskas | G04F 10/005 |

(Continued)

OTHER PUBLICATIONS

International Search Report in corresponding PCT Application No. PCT/US2022/051601, mailed Apr. 4, 2023 (3 pages).

*Primary Examiner* — Linh V Nguyen
(74) *Attorney, Agent, or Firm* — John R. Pessetto; Frank D. Cimino (57) ABSTRACT

A system includes a first digital-to-time converter (DTC) adapted to receive a first DTC code and a first clock signal. The first DTC provides an output clock signal. The system includes a calibration DTC adapted to receive a calibration DTC code and a second clock signal. The calibration DTC provides a calibration output signal. The system includes a latch comparator which provides outputs indicative of which of the output clock signal and the calibration output signal is received first. The system includes an average computation module which provides an average value of the outputs of the latch comparator. The system includes a digital controller adapted to receive the average value. The digital controller provides the DTC code and the calibration DTC code.

12 Claims, 5 Drawing Sheets

(58) Field of Classification Search
CPC . H03L 7/093; H03L 7/18; H03L 7/081; H03L 7/0802; H03L 7/0893; H03L 7/091; H03L 7/099; H03L 7/00; H03L 7/0814; H03L 7/0891; H03L 7/0992; H03L 7/0994; H03L 7/146; H03L 7/16; H03L 7/20; H03L 7/23; H03L 7/235
USPC .................. 341/118–120; 327/156, 159, 276
See application file for complete search history.

(56) References Cited

U.S. PATENT DOCUMENTS

| | | | |
|---|---|---|---|
| 9,520,890 B1* | 12/2016 | Ben-Bassat | H03M 1/1014 |
| 9,531,394 B1* | 12/2016 | Caffee | H03L 7/183 |
| 9,791,834 B1* | 10/2017 | Nassar | G04F 10/005 |
| 10,459,407 B1* | 10/2019 | Degani | H03M 1/1009 |
| 10,594,329 B1* | 3/2020 | Elkholy | H03M 3/344 |
| 10,606,217 B2* | 3/2020 | Kim | H03L 7/095 |
| 11,843,392 B2* | 12/2023 | Janardhanan | H03L 7/081 |
| 2016/0056827 A1* | 2/2016 | Vlachogiannakis | G04F 10/005 327/158 |
| 2020/0004207 A1* | 1/2020 | Degani | H03M 1/1014 |
| 2020/0218203 A1* | 7/2020 | Kim | H03L 7/095 |

\* cited by examiner

SYSTEMS AND METHODS FOR ONLINE GAIN CALIBRATION OF DIGITAL-TO-TIME CONVERTERS

CROSS REFERENCE TO RELATED APPLICATION(S)

This application is a continuation of and claims priority to U.S. patent application Ser. No. 17/541,781, filed Dec. 3, 2021, which application is incorporated by reference in its entirety.

BACKGROUND

This disclosure relates generally to digital-to-time converters (DTCs), and in particular to online gain calibration of DTCs.

DESCRIPTION OF THE RELATED ART

Digital-to-time converters (DTCs) are used in phase lock loop (PLL) systems and in fractional output dividers (FODs). In a FOD, a DTC receives an input (e.g., DTC code) from a digital controller, and, in response, the DTC synthesizes fine time edges by interpolating between input clock edges to generate a desired phase of the DTC's output signal.

The accuracy of a DTC's output phase depends on the input, clock frequency and its gain. Because a DTC may be operated uninterrupted for several years, analog impairments (such as gain deviations caused by the aging of the DTC) may occur, which may lead to a gain error. In order to compensate for the gain error, it is necessary to recalibrate the gain of the DTC.

Recalibration of a DTC during operation is challenging. There are a few known methods to recalibrate the DTC's gain during operation when the DTC code is zero. A drawback of these methods is that the probability of the DTC code being zero is very low. For example, if the DTC code has 12 bits, the probability of the code being zero is 0.00024, and thus such event rarely occurs. Other methods of recalibrating a DTC's gain during operation increase jitters in the output, which degrade the DTC's performance. Because most FODs have stringent jitter requirements (e.g., <125 femtoseconds of jitter in the output), any increase in jitter in the output may make the FODs unsuitable for the desired use.

SUMMARY

In one aspect, a system includes a first digital-to-time converter (DTC) which has a first input adapted to receive a DTC code and a second input adapted to receive a first clock signal. The first DTC provides an output clock signal at a first DTC output. The system includes a calibration DTC which has a first input adapted to receive a calibration DTC code and a second input adapted to receive a second clock signal. The calibration DTC provides a calibration output signal at a calibration DTC output. The system includes a latch comparator which has a first input coupled to the first DTC output and a second input coupled to the calibration DTC output. The latch comparator provides a plurality of output values, at a latch comparator output, indicative of which of the output clock signal and the calibration output signal is received first. The system includes an average computation module which has an input coupled to the latch comparator output. The average computation module provides, at an output of the average computation module, an average value of the plurality of output values received from the latch comparator. The system includes a digital controller which has an input coupled to the output of the average computation module. The digital controller provides the DTC code, the calibration DTC code and a gain error signal.

In an additional aspect, the digital controller includes a sigma-delta modulator which has an input adapted to receive the gain error signal. The sigma-delta modulator provides the DTC code.

In an additional aspect, the digital controller includes a code level detector which has an input adapted to receive the first DTC code. The code level detector provides a first indication if the first DTC code is less than a lower threshold and provides a second indication if the first DTC code is greater than an upper threshold.

In an additional aspect, the digital controller includes a state machine which has a first input adapted to receive the average value and a second input adapted to receive the first or the second indication. The state machine provides the gain error signal and the calibration DTC code.

In an additional aspect, the state machine aligns the output clock signal and the calibration output signal by moving the average value close to 0.5 by adjusting the calibration DTC code.

In an additional aspect, the output values provided by the latch comparator are binary numbers indicative of which of the output clock signal and the calibration output signal is received first.

In an additional aspect, a system includes a first digital-to-time converter (DTC) which has a first input adapted to receive a first DTC code and a second input adapted to receive a first clock signal. The first DTC provides an output clock signal. The system includes a calibration DTC which has a first input adapted to receive a calibration DTC code and a second input adapted to receive a second clock signal. The calibration DTC provides a calibration output signal. The system includes a latch comparator which has a first input adapted to receive the output clock signal and a second input adapted to receive the calibration output clock signal. The latch comparator provides binary outputs indicative of which of the output clock signal and the calibration output signal is received first. The system includes an average computation module which has an input adapted to receive the binary outputs and provides an average value of the binary outputs. The system includes a state machine which has a first input adapted to receive the average value and a second input adapted to receive a first indication if the first DTC code is less than a lower threshold or receive a second indication if the first DTC code is greater than an upper threshold. The state machine provides a gain error signal and the calibration DTC code. The system includes a sigma-delta modulator which has an input adapted to receive the gain error signal and provides the first DTC code.

In an additional aspect, a method of calibrating a first DTC using a calibration DTC includes providing a first digital code and a first clock signal to the first DTC and providing an output clock signal. If the first digital code is less than a lower threshold, the method includes providing a first calibration digital code and a second clock signal to the calibration DTC and providing a calibration output signal, wherein the first calibration digital code is equal to the first digital code. The method includes adjusting the first calibration digital code to align the calibration output signal with the output clock signal. The method includes delaying the second clock signal applied to the calibration DTC by one clock period and providing a third digital code to the first DTC. If the third digital code is greater than than an upper threshold, the method includes providing a second calibration digital code to the calibration DTC and adjusting the second calibration digital code to align the output clock signal and the calibration output signal.

In an additional aspect, the method includes determining a gain error of the first DTC from the adjusted second calibration digital code.

In an additional aspect, the method includes aligning an edge of the output clock signal and a corresponding edge of the calibration output signal by adjusting the second calibration digital code applied to the calibration DTC.

In an additional aspect, the method of adjusting the first calibration digital code includes providing binary outputs, responsive to the output clock signal and the calibration output signal, indicative of which of the output clock signal and the calibration output signal is received first, determining an average value of the binary outputs, and adjusting the calibration digital code until the average value of the binary outputs is close to 0.5.

BRIEF DESCRIPTION OF THE DRAWINGS

The same reference numbers or other reference designators are used in the drawings to designate the same or similar (structurally and/or functionally) features.

DETAILED DESCRIPTION

Figure 1:
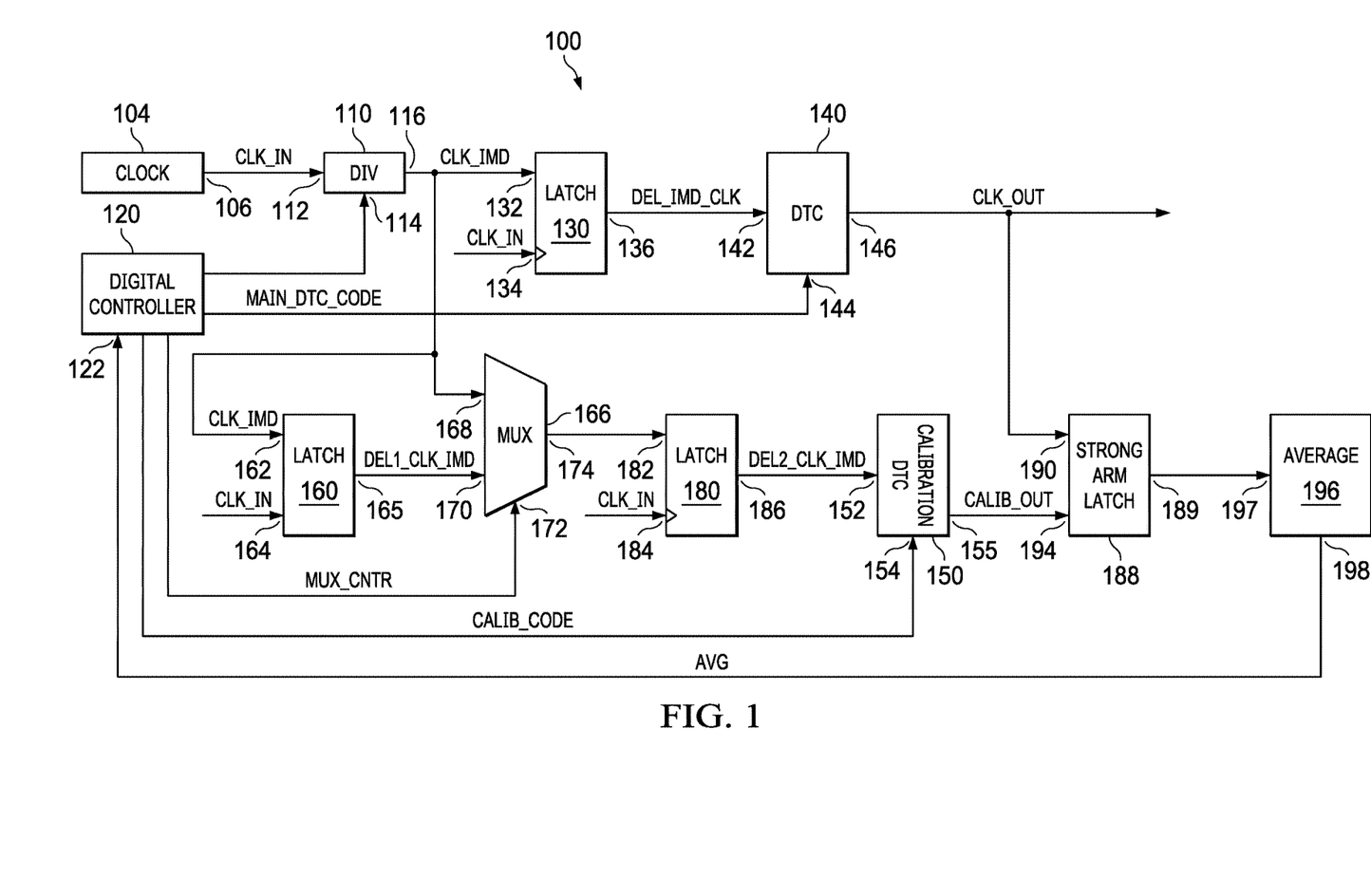
FIG. 1 is a block diagram of a fractional output divider (FOD) with gain calibration of an example embodiment.

FIG. 1 is a block diagram of a fractional output divider (FOD) 100 of an example embodiment. The FOD 100 receives an input clock signal CLK_IN and produces an output clock signal CLK_OUT by dividing CLK_IN by a fractional divider. The output clock signal CLK_OUT has a frequency equal to a specified fraction of CLK_IN.

The FOD 100 includes a signal generator 104 (e.g., oscillator, such as a bulk acoustic wave, BAW, device) which provides the input clock signal CLK_IN of a suitable frequency (e.g., 100 MHz, 1 GHz, 10 GHz) at an output 106. The FOD 100 includes a frequency divider 110 which has a first input 112 coupled to receive CLK_IN and a second input 114 coupled to receive a signal (such as a digital signal) that represents an integer N (e.g., N=2, 5, 10, 100). The integer N corresponds to an integer portion of the fractional divider. For example, if the fractional divider is 10.5, the corresponding integer portion is 10. The frequency divider 110 divides CLK_IN by the integer N and provides an intermediate clock signal CLK_IMD at an output 116.

In some example embodiments, the frequency divider 110 may be implemented with a counter which counts the number (equal to the integer portion of the fractional divider) of edges of CLK_IN to produce a signal that has a period close to the approximate period of the desired output signal. For example, if the fractional divider is 10.5, the frequency divider 110 may count 10 edges and produce a corresponding signal CLK_IMD which has the approximate period of the desired output clock signal CLK_OUT. Thus, in this example, CLK_IMD has a clock period equal to 10 clock periods of CLK_IN.

In some example embodiments, a digital controller 120 may provide instructions to the frequency divider 110 to count N edges of CLK_IN and produce CLK_IMD. The digital controller 120, or parts thereof, may be implemented in hardware (e.g., logic circuitry, state machine, microprocessor, application-specific-integrated-circuit), firmware and/or software.

The FOD 100 includes a first latch 130 which has a data input 132 coupled to receive the intermediate clock signal CLK_IMD. The first latch 130 has a clock input 134 coupled to receive the input clock signal CLK_IN. The first latch 130 delays the intermediate clock signal CLK_IMD by one clock period of CLK_IN and provides the delayed intermediate clock signal DEL_CLK_IMD at an output 136.

The FOD 100 includes a main digital-to-time converter (DTC) 140 which is also referred to as the first DTC 140. The main DTC 140 has a first input 142 coupled to receive the delayed intermediate clock signal DEL_CLK_IMD and has a second input 144 coupled to receive a main DTC code MAIN_DTC_CODE. In some example embodiments, the digital controller 120 may provide MAIN_DTC_CODE to the main DTC 140. The main DTC code MAIN_DTC_CODE may instruct the main DTC 140 to interpolate a fractional period of the input clock signal CLK_IN and add the fractional period between edges of DEL_IMD_CLK to produce an output clock CLK_OUT at an output 146. This has the effect of producing the desired length between edges of CLK_OUT by adding the fractional period between the edges.

For example, if the fractional divider is 10.5, the integer portion is 10 and the fractional portion is 0.5. The frequency divider 110 divides CLK_IN by 10 (i.e., integer portion of the fractional divider). The main DTC code MAIN_DTC_CODE may instruct the main DTC 140 to interpolate a fractional period which is equal to 0.5 period of CLK_IN. The main DTC 140 may determine 0.5 period of CLK_IN and add 0.5 of a period of CLK_IN between edges of DEL_IMD_CLK in order to produce the desired length between the edges of CLK_OUT. The effect of this is that the output clock signal CLK_OUT at the output 146 has a clock period equal to 10.5 clock periods of CLK_IN.

In some example embodiments, the process of interpolating the fractional period of CLK_IN is repeated for each period of CLK_OUT. Because the fractional ratio causes the edge relationships between CLK_IN and CLK_OUT to continually change, each period requires a different amount of interpolation. In some example embodiments, a sigma delta modulator (not shown in FIG. 1) is implemented to compute the amount of interpolation.

In some example embodiments, the main DTC code MAIN_DTC_CODE is a 12-bit binary number. Thus, MAIN_DTC_CODE may have a maximum value of 4096 and a minimum value of 0. In other embodiments, MAIN_DTC_CODE may have a higher or lower number of bits.

Because the FOD 100 may be operated uninterrupted for many years, the gain of the main DTC 140 may deviate over time due to analog impairments. For example, over time capacitance values of capacitors may change resulting in a gain error, which requires a correction (i.e., recalibration) of the main DTC 140's gain to compensate for the gain error.

In an example embodiment, the main DTC 140 is calibrated while in operation without degrading its performance. The FOD 100 includes a calibration DTC 150 which is also referred to as the second DTC 150. The calibration DTC 150 is used to calibrate the main DTC 140 while in operation.

The FOD 100 includes a second latch 160 which has a data input 162 coupled to receive the intermediate clock signal CLK_IMD and has a clock input 164 coupled to receive the input clock signal CLK_IN. The second latch 160 adds a delay of one clock period of CLK_IN to the intermediate clock signal CLK_IMD and provides a delayed intermediate clock signal DEL1_CLK_IMD at an output 165. The FOD 100 includes a multiplexer 166 which has a first input 168 coupled to receive CLK_IMD from the frequency divider 110 and has a second input 170 coupled to receive DEL1_CLK_IMD from the second latch 160. The multiplexer 166 has a control input 172 coupled to receive a multiplexer control signal MUX_CNTR which may be provided by the digital controller 120. Responsive to the multiplexer control signal MUX_CNTR, the multiplexer 166 selects one of the CLK_IMD and DEL1_CLK_IMD, and provides the selected signal at an output 174. The FOD 100 includes a third latch 180 which has a data input 182 coupled to the output 174 of the multiplexer 166. The third latch 180 has a clock input 184 coupled to receive the input clock signal CLK_IN. The third latch 180 applies a delay of one clock period of CLK_IN to the output of the multiplexer 166 (e.g. either CLK_IMD or DEL1_CLK_IMD). The third latch 180 provides a signal DEL2_CLK_IMD at an output 186. The signal DEL2_CLK_IMD may be a delayed intermediate clock signal (if CLK_IMD is output by the multiplexer 166) or a delayed clock signal (if DEL1_CLK_IMD is output by the multiplexer 166). Depending on whether the multiplexer 166 selects the signal at its first input 168 or the signal at its second input 170, the signal path may include a delay equal to one clock period of CLK_IN or two clock periods of CLK_IN.

The calibration DTC 150 includes a first input 152 coupled to the output 186 of the third latch 180 and includes a second input 154 coupled to receive a calibration code CALIB_CODE which may be provided by the digital controller 120. Responsive to the calibration code CALIB_CODE, the calibration DTC 150 interpolates a fraction of a period of CLK_IN and adds the fractional period between two edges of DEL2_CLK_IMD and provides CALIB_OUT at an output 155.

In an example embodiment, the gain of the main DTC 140 is calibrated in two calibration stages using the calibration DTC 150. In a first calibration stage, the gain of main DTC 140 is calibrated when the main DTC code MAIN_DTC_CODE is near or close to 0.

In the first calibration stage, responsive to the multiplexer control signal MUX_CNTR, the multiplexer 166 selects the signal at its first input 168. Thus, in the first calibration stage the multiplexer 166 selects CLK_IMD which is provided by the frequency divider 110. The selected signal CLK_IMD is received by the third latch 180 which applies a delay of one clock period of CLK_IN and outputs DEL2_CLK_IMD.

With DEL2_CLK_IMD being applied to the calibration DTC 150, the calibration DTC 150's gain is aligned with the main DTC 140's gain when the main DTC code MAIN_DTC_CODE is near or close to 0.

If, for example, MAIN_DTC_CODE is a 12 bit binary number, it has a minimum value of zero and a maximum value of 4096. The digital controller 120 compares MAIN_DTC_CODE to a lower threshold, and if MAIN_DTC_CODE is less than or equal to the lower threshold, MAIN_DTC_CODE is considered by the digital controller 120 to be near or close to 0. The lower threshold may be set by user inputs or system requirements.

As an example, the lower threshold may be set to 15. Thus, a MAIN_DTC_CODE which may have a value between 0 and 15 may be considered near or close to 0. In contrast to existing methods that require the DTC code to be 0 for calibration, which is a rare occurrence due to the low probability of the DTC code being equal to 0, the disclosed embodiments only require MAIN_DTC_CODE to be near or close to 0. By requiring MAIN_DTC_CODE to be near or close to 0 instead of exactly 0, the probability of its occurrence is greatly increased. If the lower threshold is set to 15, the probability of occurrence of MAIN_DTC_CODE having a value near or close to 0 is fifteen times higher than the probability of occurrence of the code having a value of 0. By increasing the lower threshold number, the probability of occurrence of the desired code can be increased, thereby enabling frequent calibration of the main DTC 140 during operation.

If MAIN_DTC_CODE is near or close to 0, the digital controller 120 sets CALIB_CODE equal to MAIN_DTC_CODE. For example, if MAIN_DTC_CODE is 15, CALIB_CODE is equal to 15. With CALIB_CODE equal to MAIN_DTC_CODE, CALIB_CODE is adjusted to align edges of the calibration DTC 150's output signal (CALIB_OUT) with corresponding edges of the output signal (CLK_OUT) of the main DTC 140. The calibration DTC code CALIB_CODE is adjusted to minimize any time difference between the edges of CLK_OUT with the corresponding edges of CALIB_OUT. This is done using a strong arm latch (SAL) 188. The SAL 188 is a latch comparator which has a first input 190 at which the output CLK_OUT of the main DTC 140 is received and has a second input 194 at which the output CALIB_OUT of calibration DTC 150 is received. The SAL 188 determines, for each pair of input signals received, which arrived first, and provides a binary number (0 or 1) at an output 196 indicating which input signal arrived first.

Due to non-ideal operating conditions, noise and jitter may be present in CLK_IN. The effect of this is that the output of the first DTC 140 (CLK_OUT) and the output of the calibration DTC 150 (CALIB_OUT) may not arrive at exactly the same time. Thus, the edges of CALIB_OUT is not perfectly aligned with the edges of CLK_OUT, which causes the SAL 188 to output binary 0 or binary 1.

For example, if responsive to increases in CALIB_CODE, the time difference between the edges of CALIB_OUT and the edges of CLK_OUT tend to move closer, the distribution of 0 s and 1s at the output of the SAL 188 will move near equal. Thus, if responsive to increases in CALIB_CODE, CALIB_OUT and CLK_OUT move closer and closer to alignment, there will be approximately equal number of 0s and 1s in the output of the SAL 188. Therefore, an average of a sample (e.g., 100, 200) of the outputs of the SAL 188 will tend to move near 0.5. Conversely, if responsive to increases in the calibration code, CALIB_OUT and CLK_OUT tend to move farther away from alignment, there will be unequal number of 0s and is at the output of the SAL 188. If CALIB_OUT and CLK_OUT move farther away from alignment, there will be an increasing number of 1s and a decreasing number of 0 s, or there will be an increasing number of 0s and decreasing number of 1 s. Thus, an average of a sample (e.g., 100, 200) of the outputs will tend to move farther away from 0.5 (near 1 or near 0). Based on the average of a sample of outputs of the SAL 188, a determination can be made whether increases or decreases in CALIB_CODE causes CALIB_OUT and CLK_OUT to move closer to alignment or not.

The FOD 100 includes an average computation unit 196 which has an input 197 at which the output of the SAL 188 is received. The average computation unit 196 computes the average of a sample (e.g., 100, 200) of the output of SAL 188 and provides an average value AVG at an output 198. The digital controller 120 receives the average value AVG at an input 122 and in response adjusts CALIB_CODE to adjust the gain of the calibration DTC 150 until the output AVG of the average computation unit 196 is approximately 0.5 which indicates that the output of the calibration DTC 150 (CALIB_OUT) is aligned with the output of the main DTC 140 (CLK_OUT). The average computation unit 196 is a functional unit which may be implemented in hardware (e.g., logic circuitry, microprocessor, application-specific-integrated-circuit), firmware and/or software.

After the main DTC 140 is calibrated at close to or near 0 DTC code (e.g. MAIN_DTC_CODE is less than the threshold value discussed above) in the first stage, the main DTC 140 is calibrated in a second stage when the DTC code is close to or near full code (i.e., maximum value) (e.g. MAIN_DTC_CODE is greater than or equal to an upper threshold value discussed below). In the second stage, responsive to the multiplexer control signal MUX_CNTR, the multiplexer 166 selects the signal at its second input 170 (DEL1_CLK_IMD). The multiplexer 166 provides DEL1_CLK_IMD to the third latch 180 which in turns applies a delay equal to one clock period of CLK_IN and provides DEL2_CLK_IMD to the calibration DTC 150. In the second stage, the main DTC 140 receives a signal which is delayed by one clock period of CLK_IN while the calibration DTC 150 receives a signal which is delayed by two clock periods of CLK_IN. Thus, the input signal to the calibration DTC 150 is one clock period of CLK_IN delayed relative to the input signal to the main DTC 140.

With DEL2_CLK_IMD applied to the calibration DTC 150, CALIB_CODE is adjusted (i.e., increased or decreased) to align the calibration DTC 150's output with the main DTC 140's output when MAIN_DTC_CODE is near or close to full code. If, for example, MAIN_DTC_CODE is a 12 bit binary number, it has a maximum value of 4096. The digital controller 120 compares MAIN_DTC_CODE to an upper threshold, and if MAIN_DTC_CODE is greater than or equal to the upper threshold, MAIN_DTC_CODE is considered by the digital controller 120 to be near or close to the full code. The upper threshold may be set by user inputs or system requirements.

As an example, the upper threshold may be set to be equal to full code minus 15 (e.g., 4096-15). Thus, a MAIN_DTC_CODE between 4081 and 4096 may be considered near or close to the full code. In contrast to existing methods that require the code to be at the full code value for calibration, which is a rare occurrence, the invention only requires MAIN_DTC_CODE to be near or close to the full code. By requiring MAIN_DTC_CODE to be near or close to the full code instead of the full code, the probability of its occurrence is greatly increased, thereby enabling frequent calibration of the main DTC 140 during operation.

If MAIN_DTC_CODE is near or close to full code, the digital controller 120 sets CALIB_CODE equal to a value near 0 (e.g. it is set to full code minus MAIN_DTC_CODE). For example, if MAIN_DTC_CODE is 4090, CALIB_CODE is set to 6 (4096-4090=6).

In the FOD 100, any component that adds delay, even 10's of picoseconds, should be avoided. Because the first latch 130 adds a delay to the input signal to the first DTC 140, the third latch 180 is added to the signal path of the calibration DTC 150. The third latch 180 adds a delay in the signal path to the calibration DTC 150 which compensates for the delay added by the first latch 130. However, when the multiplexer 166 selects the signal at its second input 170, an additional delay is added to the signal path by the second latch 160. As a result, the input signal to the calibration DTC 150 is delayed by one clock period of CLK_IN relative to the input signal to the first DTC 140. To compensate for the additional delay, the digital controller 120 sets CALIB_CODE equal to a value near 0 (e.g. full code minus MAIN_DTC_CODE).

With CALIB_CODE equal to zero (or near zero), CALIB_CODE is then adjusted (i.e., increased or decreased) to align the edges of the calibration DTC 150's output signal (CALIB_OUT) with the edges of the main DTC 140's output signal (CLK_OUT). The calibration DTC code CALIB_CODE is adjusted to minimize any time difference between the edges of CLK_OUT with the corresponding edges of CALIB_OUT. This is done using a strong arm latch (SAL) 188 as described before.

The outputs of the SAL 188 are received by the average computation unit 196 which computes the average of a sample of the outputs of the SAL 188. The average computation unit 196 produces an average value AVG at the output 198. The digital controller 120 receives the average value AVG at an input 122, and in response adjusts CALIB_CODE to adjust the gain of the calibration DTC 150 until the output of the average computation unit 196 (AVG) is approximately 0.5 which indicates that the output of the calibration DTC 150 (CALIB_OUT) is aligned with the output of the main DTC 140 (CLK_OUT) when the DTC code DTC1_CODE is close to or near full code. The gain error of the main DTC 140 is then determined from the incremental or decremental adjustment applied to CALIB_CODE from the initial near or close to full code to an adjusted code when CALIB_OUT is aligned with CLK_OUT (i.e., AVG is approximately 0.5).

For example, for a 12-bit DTC code, the full code is 4096 and the initial code (the initial code for MAIN_DTC_CODE) may be 4090 (i.e. close to or near full code). Thus, the initial calibration code CALIB_CODE is six (full code minus the initial code of 4090). If CALIB_OUT and CLK_OUT are aligned when the adjusted CALIB_CODE is 100, the main DTC 140's gain error=100−(−6)=106. The gain error is used to compute a gain corrected fraction Fc. If F is the fraction, the gain corrected fraction Fc can be expressed by the equation:

$$Fc = F * (\text{full code} - \text{gain error}) / \text{full code}$$

If, for example, full code is equal to 4096 and the gain error is 106, Fc=F*(4096−106)/4096. In some example embodiments, a sigma delta modulator computes the gain corrected fraction Fc which is used to generate the main DTC code MAIN_DTC_CODE.

The FOD 100 described herein may include one or more semiconductor elements (such as transistors), one or more passive elements (such as resistors, capacitors and/or inductors), and/or one or more sources (such as voltage and/or current sources). The FOD 100 may include only semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, such as by an end-user and/or a third party.

Figure 2:
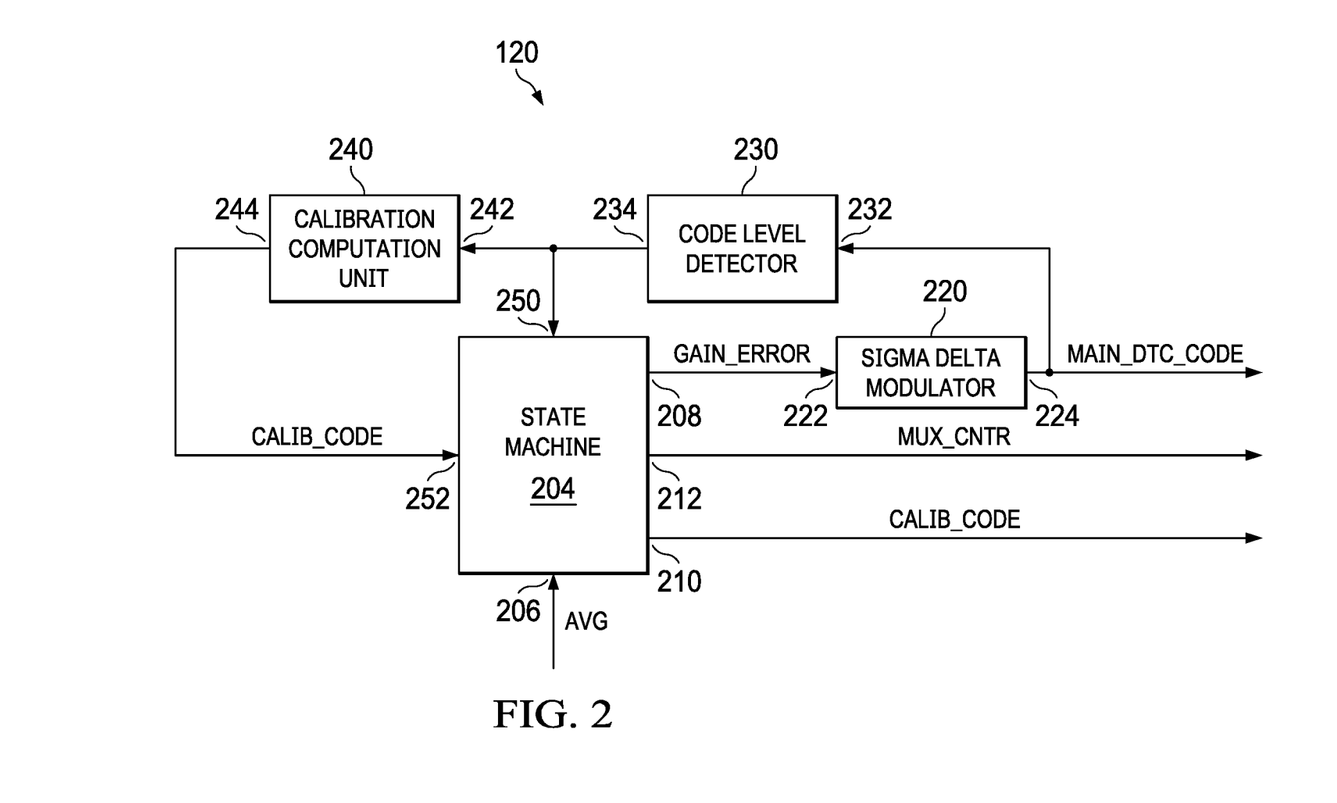
FIG. 2 is a block diagram of a digital controller of an example embodiment.

FIG. 2 is a block diagram of the digital controller 120 of an example embodiment. The controller 120 includes a state machine 204 which has a first input 206 coupled to receive the average value AVG from the average computation unit 196. The state machine 204 has a second input 250 coupled to receive an indication of near 0 code or near full code, and has a third input 252 coupled to receive the calibration DTC code CALIB_CODE. The state machine 204 provides a gain error signal GAIN_ERROR at a first output 208, the calibration DTC code CALIB_CODE at a second output 210, and the multiplexer control signal MUX_CNTR at a third output 212. In some example embodiments, the state machine 204 does not receive the calibration DTC code CALIB_CODE but instead the state machine 204 computes the calibration DTC code CALIB_CODE based on the average value AVG and the indications of near 0 code or near full code. The state machine 204, or parts thereof, may be implemented in hardware (e.g., logic circuitry, microprocessor, application-specific-integrated-circuit), firmware and/or software.

The digital controller 120 includes a sigma-delta modulator 220 which has an input 222 coupled to receive the gain error signal GAIN_ERROR and provides the main DTC code MAIN_DTC_CODE at an output 224. The main DTC 140 receives MAIN_DTC_CODE and interpolates a fraction of one clock period of CLK_IN and adds the fractional period between clock edges of DEL_IMD. This has the effect of producing the desired length between edges of CLK_OUT by adding the fractional period between the edges. The sigma-delta modulator 220, or parts thereof, may be implemented in hardware (e.g., logic circuitry, state machine, microprocessor, application-specific-integrated-circuit), firmware and/or software.

The digital controller 120 includes a code level detector 230 which has an input 232 coupled to receive the main DTC code MAIN_DTC_CODE. The code level detector 230 compares MAIN_DTC_CODE to a lower threshold and an upper threshold, and detects if a near 0 code or a near full code has arrived. If a near 0 code or a near full code is detected, the code level detector 230 provides an indication of near full code or near 0 code at an output 234. The digital controller 120 includes a calibration code computation unit 240 which has an input 242 coupled to receive the indication of near 0 code or near full code. The calibration code computation unit 240 computes the calibration code CALIB_CODE based on the near 0 code or near full code and provides CALIB_CODE at an output 244. The state machine 204 has a second input 250 coupled to receive the indication of near 0 code or near full code and a third input 252 coupled to receive CALIB_CODE. In response to receiving inputs 250 and 252, state machine 204 provides the multiplexer control signal MUX_CNTR. If a near 0 code is detected, the MUX_CNTR signal instructs the multiplexer 166 to select the signal at its first input 168, and if a near full code is detected the MUX_SELECT signal instructs the multiplexer 166 to select the signal at its second input 170. Because calibrating in two stages described herein requires a near 0 code and a near full code, if these two conditions are not detected, the state machine 204 waits until the occurrence of the conditions.

In some example embodiments, the digital controller 120 does not include the calibration code computation unit 240. Instead, the state machine 204 computes the calibration DTC code CALIB_CODE based on the first or the second indications received at the input 250. The code level detector 230 and the calibration code computation unit 240 may be implemented in hardware (e.g., logic circuitry, state machine, microprocessor, application-specific-integrated-circuit), firmware and/or software.

Figure 3:
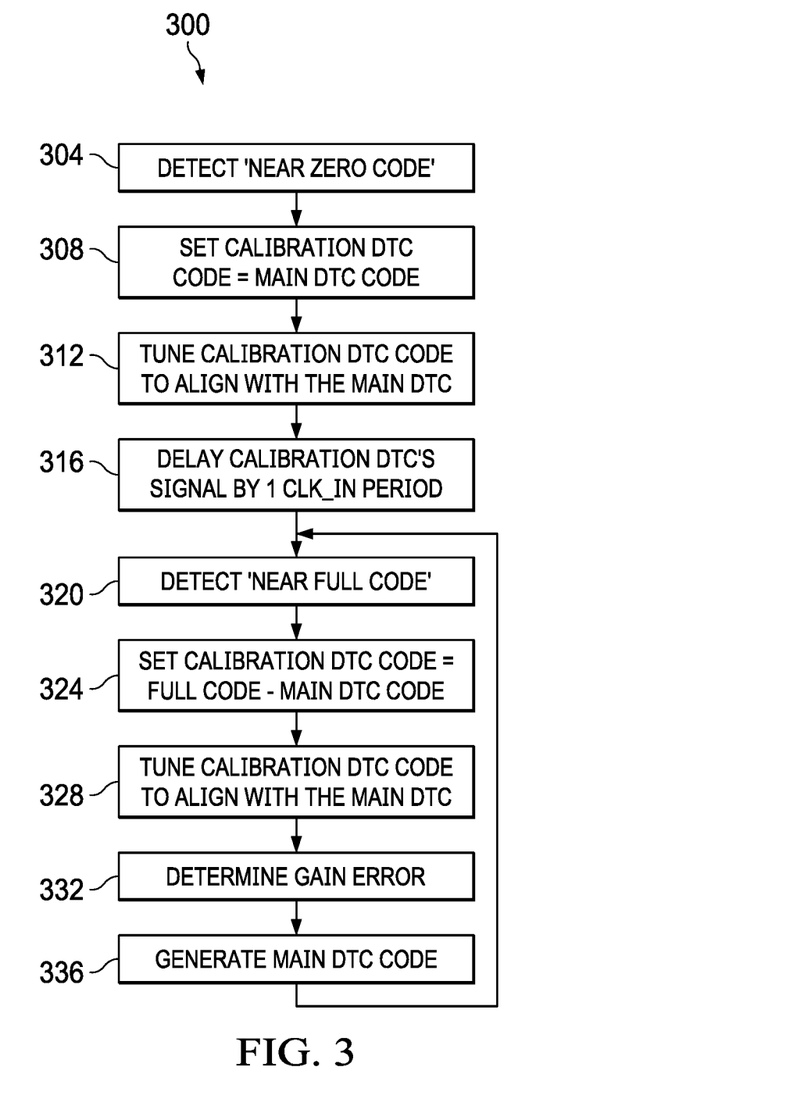
FIG. 3 is a flow diagram of a method of an example embodiment.

FIG. 3 is a flow diagram of a method 300 of an example embodiment. In block 304, a near 0 code is detected. In an example embodiment, the code level detector 230 compares MAIN_DTC_CODE with a lower threshold, and if MAIN_DTC_CODE is less than the lower threshold, the code level detector 230 determines a near 0 code has arrived.

In block 308, the calibration DTC code CALIB_CODE is set equal to MAIN_DTC_CODE. Thus, CALIB_CODE is set equal to the detected near 0 code. In an example embodiment, the state machine 204 receives an indication of the near 0 code and sets CALIB_CODE equal to the near 0 code. In block 312, CALIB_CODE is adjusted to align edges of CALIB_OUT (the output of the calibration DTC 150) with corresponding edges of CLK_OUT (the output of the main DTC 140). In an example embodiment, a strong arm latch 188 receives CLK_OUT and CALIB_OUT. The strong arm latch 188 determines, for each pair of input signals received, which arrived first, and provides a binary number (0 or 1) at an output 189 indicating which input signal arrived first. An average decision module 196 receives multiple outputs from the strong arm latch 188 in a set period period, computes the average AVG of the outputs and provides an average value AVG to the state machine 204. The state machine 204 receives the average value AVG and, in response, adjusts CALIB_CODE to align CALIB_OUT with CLK_OUT.

In block 316, the input to the calibration DTC 150 is delayed by an additional one clock period of CLK_IN relative to the input to the main DTC 140. In an example embodiment, the multiplexer 166 selects the signal from its second input 170 which is delayed by one clock period of CLK_IN by the second latch 160. Thus, the signal path to the input 152 of the calibration DTC 150 includes an additional delay of one clock period of CLK_IN relative to the signal path to the input 142 of the main DTC 140.

In block 320, a near full code is detected. In an example embodiment, the code level detector 230 compares the MAIN_DTC_CODE to an upper threshold, and if the MAIN_DTC_CODE is greater than the upper threshold, the code level detector 230 determines that a near full code has arrived and provides an indication of the near full code to the state machine 204. In block 324, responsive to the near full code indication, the state machine 204 sets CALIB_CODE equal to 0 (near full code minus DTC1_CODE). In block 328, CALIB_CODE is then adjusted (i.e., increased or decreased) to align the edges of CALIB_OUT with corresponding edges of CLK_OUT.

In an example embodiment, the strong arm latch 188 determines, for each pair of CLK_OUT and CALIB_OUT, which arrived first, and provides a binary number (0 or 1) indicating which input signal arrived first. The average computation unit 196 computes the average of a sample of the outputs of the strong arm latch 188 and provides an average value AVG to the state machine 204, (which, in turn, adjusts CALIB_CODE to align CALIB_OUT with CLK_OUT).

In block 332, the gain error of the main DTC 140 is determined from the incremental adjustments (e.g. the incremental increase or decrease supplied via SAL 188) applied to CALIB_CODE from the initial near or close to full code to the adjusted code when CALIB_OUT is aligned with CLK_OUT. In some example embodiments, in block 336, the gain error is used by the sigma delta modulator 220 to compute a gain corrected fraction Fc which is used to generate the main DTC code MAIN_DTC_CODE. The method then returns to block 320.

In some embodiments, the gain error may be passed through a low pass filter (not shown in FIG. 3) to eliminate and/or suppress any spurious changes in the gain error. For example, the gain error computed by the state machine 204 may be passed through a low pass filter (not shown in FIG.

2) to remove high frequency components, and the filtered gain error is used by the sigma delta modulator 220 to generate the main DTC code MAIN_DTC_CODE. The effect of this is any spurious change in gain error will not effect the phase of CLK_OUT.

In some example embodiments, after block 336 the method returns to block 304 (not shown in FIG. 3) if certain conditions change. For example, if the temperature sensed by an on-chip temperature sensor changes by a predetermined threshold, the method returns to block 304. In some example embodiments, the gain error measurement can be repeated multiple times and filtered prior to being applied to the main DTC 140.

Figure 4A:
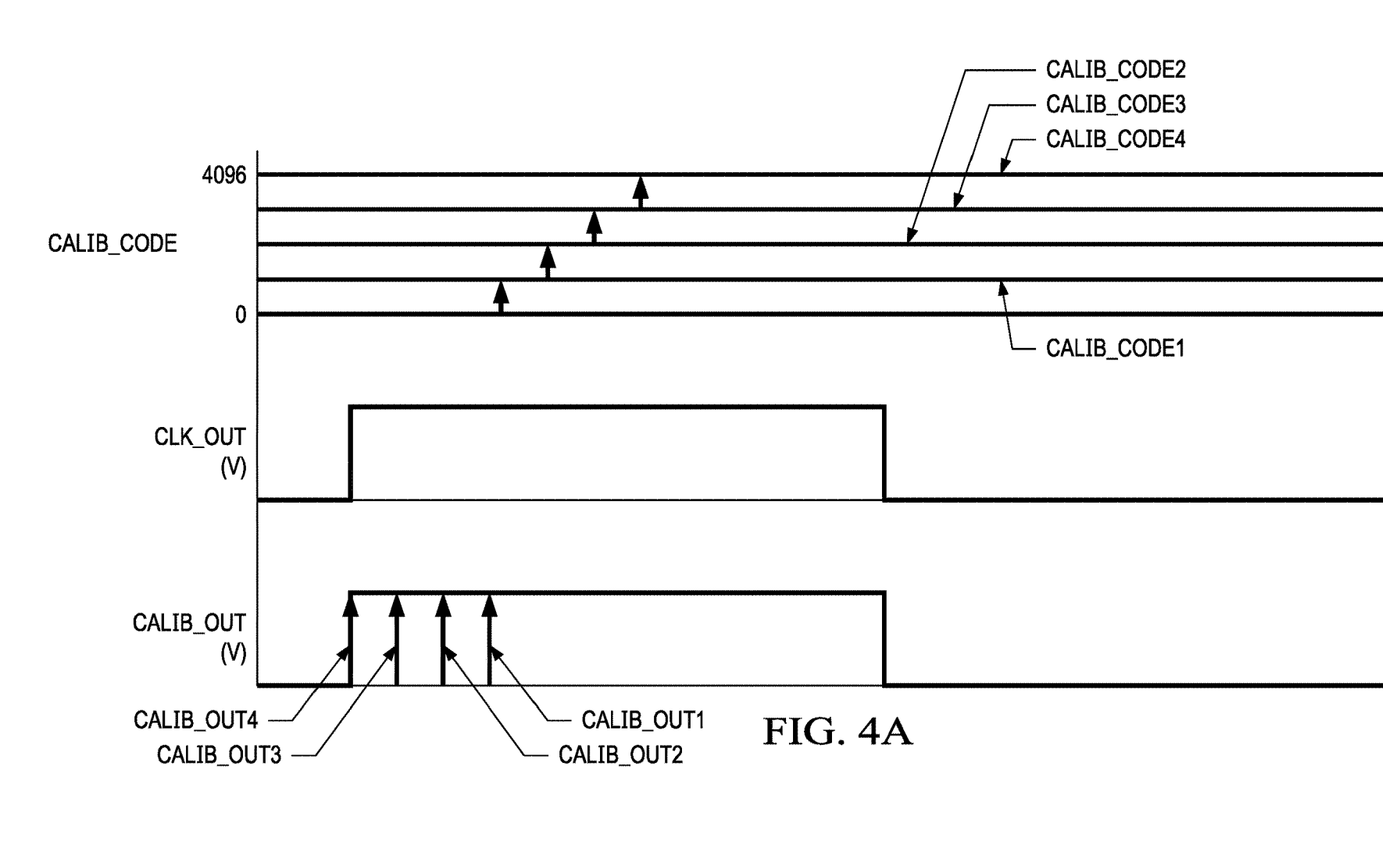
FIGS. 4A and 4B are timing diagrams of example methods of calibrating a DTC.
Figure 4B:
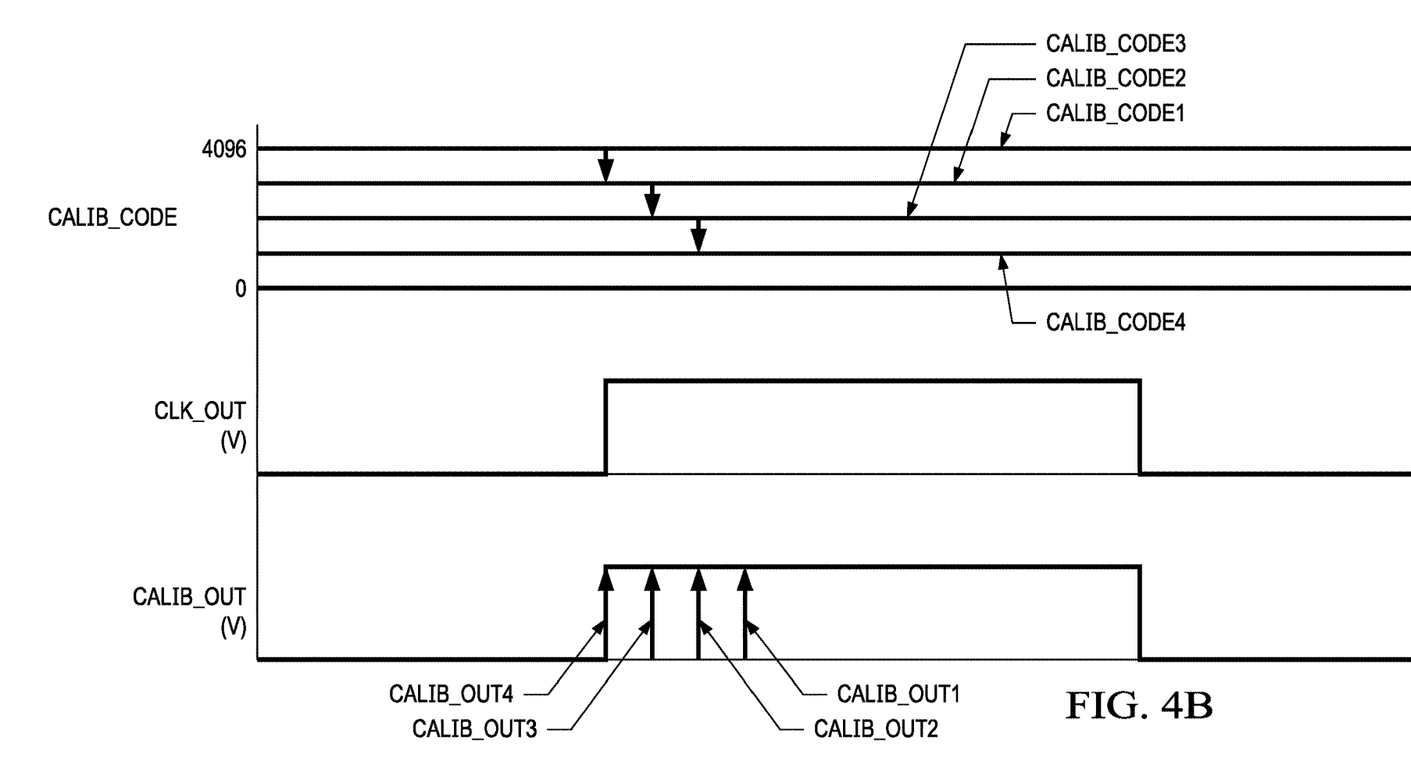

FIGS. 4A-4B are timing diagrams of an example method of calibrating the DTC 150. In FIG. 4A, the x-axis represents time with respect to graphs for CLK_OUT and CALIB_OUT. The y-axis represents voltage with respect graphs for CLK_OUT and CALIB_OUT. With respect to the graph for CALIB_CODE, the y-axis represents code value which in this example varies from 0 to $2^{12}$ while the x-axis is not indicative of time. When MAIN_DTC_CODE is near 0, CALIB_CODE is set to CALIB_CODE1 which is near 0 (i.e., CALIB_CODE is set equal to MAIN_DTC_CODE). In response, the main DTC 140 outputs CLK_OUT and the calibration DTC 150 outputs CALIB_OUT1. Because the rising edge of CALIB_OUT1 lags the rising edge of CLK_OUT, CALIB_CODE is increased to CALIB_CODE2 which causes the rising edge of CALIB_OUT2 to shift closer to the rising edge of CLK_OUT, but CALIB_OUT2 is not yet aligned with CLK_OUT. The processs is repeated until CALIB_CODE is adjusted to CALIB_CODE4, which causes CALIB_OUT4 to shift and be aligned with CLK_OUT. In the example of FIG. 4A, only the rising edge of CALIB_OUT is shifted by varing CALIB_CODE. In some example embodiments (not shown in FIG. 4A), both the rising and falling edges of CALIB_OUT may not be aligned with corresponding edges of CLK_OUT, thus requiring adjustments to both the rising and falling edges of CALIB_OUT in order to align CALIB_OUT with CLK_OUT.

In FIG. 4B, the x-axis represents time with respect to graphs for CLK_OUT and CALIB_OUT. The y-axis represents voltage with respect graphs for CLK_OUT and CALIB_OUT. With respect to the graph for CALIB_CODE, the y-axis represents code value which in this example varies from 0 to $2^{12}$ while the x-axis is not indicative of time. When MAIN_DTC_CODE is near full code, CALIB_CODE is set to CALIB_CODE1=near full code. In response, the main DTC 140 outputs CLK_OUT and the calibration DTC 150 outputs CALIB_OUT1. Because, the rising edge of CALIB_OUT1 lags the rising edge of CLK_OUT, CALIB_CODE is decreased to CALIB_CODE2 which causes the rising edge of CALIB_OUT2 to shift closer to the rising edge of CLK_OUT, but CALIB_OUT2 is not yet aligned with CLK_OUT. The processs is repeated until CALIB_CODE is adjusted to CALIB_CODE4, which causes CALIB_OUT4 to shift and align with CLK_OUT. In the example of FIG. 4B, only the rising edge of CALIB_OUT is shifted by varing CALIB_CODE. In some example embodiments, both the rising and falling edges of CALIB_OUT will not be aligned with corresponding edges of CLK_OUT, thus requiring adjustments to both the rising and falling edges of CALIB_OUT in order to align CALIB_OUT with CLK_OUT.

In this description, the term "couple" may cover connections, communications, or signal paths that enable a functional relationship consistent with this description. For example, if device A provides a signal to control device B to perform an action, then: (a) in a first example, device A is coupled to device B; or (b) in a second example, device A is coupled to device B through intervening component C if intervening component C does not substantially alter the functional relationship between device A and device B, such that device B is controlled by device A via the control signal provided by device A. Also, in this description, a device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof. Furthermore, in this description, a circuit or device that includes certain components may instead be adapted to be coupled to those components to form the described circuitry or device. For example, a structure described as including one or more semiconductor elements (such as transistors), one or more passive elements (such as resistors, capacitors and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, such as by an end-user and/or a third party.

As used herein, the terms "terminal", "node", "interconnection" and "pin" are used interchangeably. Unless specifically stated to the contrary, these terms are generally used to mean an interconnection between or a terminus of a device element, a circuit element, an integrated circuit, a device or other electronics or semiconductor component.

While some example embodiments suggest that certain elements are included in an integrated circuit while other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

While certain components may be described herein as being of a particular process technology, these components may be exchanged for components of other process technologies. Circuits described herein are reconfigurable to include the replaced components to provide functionality at least partially similar to functionality available before the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in series or in parallel between the same two nodes as the single resistor or capacitor. Also, uses of the phrase "ground terminal" in this description include a chassis ground, an Earth ground, a floating ground, a virtual ground, a digital ground, a common ground, and/or any other form of ground connection applicable to, or suitable for, the teachings of this description. Unless otherwise stated, "about", "approximately", or "substantially" preceding a value means+/−10 percent of the stated value.

Modifications are possible in the described embodiments, and other embodiments are possible, within the scope of the claims.

What is claimed is:

1. A system comprising:
    a first digital-to-time converter (DTC) having a first input, a second input and a first DTC output;
    a calibration DTC having a first input, a second input and output;
    a latch comparator having a first input coupled to the first DTC output and a second input coupled to the output of the calibration DTC and an output;
    an average computation module having an input coupled to the output of the latch comparator and an output and
    a digital controller having an input coupled to the output of the average computation module, the digital controller operable to provide a DTC code, a calibration DTC code, and a gain error signal.

2. The system of claim 1, wherein the digital controller comprises a sigma-delta modulator having an input adapted to receive the gain error signal and operable to provide the DTC code.

3. The system of claim 1, wherein the digital controller comprises a code level detector having an input adapted to receive the DTC code and operable to provide a first indication if the DTC code is less than a lower threshold and to provide a second indication if the DTC code is greater than an upper threshold.

4. The system of claim 3, wherein the digital controller comprises a state machine having a first input adapted to receive an average value and a second input adapted to receive the first or the second indication, the state machine operable to provide the gain error signal and the calibration DTC code.

5. The system of claim 4, wherein the state machine is operable to adjust the calibration DTC code to move the average value close to 0.5.

6. The system of claim 4, wherein the state machine is operable to align an output clock signal and an calibration output signal by moving the average value close to 0.5 by adjusting the calibration DTC code.

7. The system of claim 1, wherein output values provided by the latch comparator are binary numbers indicative of which of an output clock signal and an calibration output signal is received first.

8. A system comprising:
    a state machine having a first input, a second input, a first output and a second output;
    a first digital-to-time converter (DTC) having a first input, a second input, and an output;
    a calibration DTC having a first input, a second input the second output of the state machine and an output;
    a latch comparator having a first input coupled to the first DTC output and a second input coupled to the calibration DTC output and an output;
    an average computation module having an input coupled to the latch comparator output and an average computation module coupled to the first input of the state machine;
    a code level detector having an input coupled to the second input of the first DTC and operable to provide a first indication signal, at a code level detector output, if a first DTC code is less than a lower threshold and to provide a second indication signal, at the code level detector output, if the first DTC code is greater than an upper threshold;
    a calibration DTC code computation module having a first input coupled to the code level detector output and operable to provide a calibration DTC code at a calibration DTC code computation module output that is coupled to the second input of the state machine; and
    a sigma-delta modulator having an input coupled to the first state machine output and operable to provide the first DTC code at a modulator output coupled to the second input of the first DTC.

9. The system of claim 8, wherein the average value signal indicates an average value, and wherein the state machine is operable to adjust the calibration DTC code to move the average value close to 0.5.

10. The system of claim 9, wherein the state machine is operable to align an output clock signal and a calibration output signal by moving the average value close to 0.5 by adjusting the calibration DTC code.

11. The system of claim 8, wherein the latch comparator is operable to provide binary numbers indicative of which of an output clock signal and an calibration output signal is received first.

12. The system of claim 11, wherein the average computation module is operable to provide the average value of the binary numbers.

* * * * *